(12) United States Patent
Anand et al.

(10) Patent No.: US 6,414,487 B1
(45) Date of Patent: Jul. 2, 2002

(54) TIME AND MEMORY OPTIMIZED METHOD OF ACQUIRING AND RECONSTRUCTING MULTI-SHOT 3D MRI DATA

(75) Inventors: Christopher K. Anand, Chesterland; James A. Halamek, Independence; C. Michael Steckner, Richmond Heights, all of OH (US)

(73) Assignee: Philips Medical Systems (Cleveland), Inc., Highland Heights, OH (US)

( * ) Notice: Subject to any disclaimer, the term of this patent is extended or adjusted under 35 U.S.C. 154(b) by 10 days.

(21) Appl. No.: 09/719,000

(22) Filed: Nov. 22, 2000

(51) Int. Cl.$^7$ .................................................. G01V 3/00
(52) U.S. Cl. ........................................ 324/309; 324/307
(58) Field of Search ................................ 324/307, 309, 324/306, 312, 314, 300

(56) References Cited

U.S. PATENT DOCUMENTS

| | | | |
|---|---|---|---|
| 5,122,747 A | 6/1992 | Reiderer et al. | 324/309 |
| 5,168,226 A | 12/1992 | Hinks | 324/309 |
| 5,873,825 A | 2/1999 | Mistretta et al. | 600/401 |
| 5,912,557 A | 6/1999 | Wilman et al. | 324/309 |
| 6,075,362 A | 6/2000 | Loncar et al. | 324/309 |
| 6,144,874 A * | 11/2000 | Du | 324/307 |
| 6,265,873 B1 * | 7/2001 | Le Roux | 324/307 |
| 6,320,378 B1 * | 11/2001 | Maier et al. | 324/307 |

OTHER PUBLICATIONS

Kholmovski, et al. "Isotropic K–Space Sampling Scheme for 3D Fast Spin Echo".

Haacke et al., *Magnetic Resonance Imaging—Physical Principles and Sequence Design,* Chapter 19—Segmented k–Space and Echo Planar Imaging, Wiley & Sons, Inc., 1999, pp 513–568.

Mulkern, et al. "Contrast Manipulation and Artiface Assessment of 2D and 3D RARE Sequences", Magnetic Resonance Imaging, vol. 8; pp. 557–566 1990.

Oshio, et al., "T2–Weighted Thin–Section Imaging with the Multislab Three–Dimensional RARE Technique", JMRI 1991: 1:695–700.

Hennig, et al. "RARE Imaging: A Fast Imaging Method for Clinical MR", Magnetic Resonance in Medicine 3, 823–833 (1986).

* cited by examiner

*Primary Examiner*—Louis Arana
(74) *Attorney, Agent, or Firm*—Fay, Sharpe, Fagan, Minnich & McKee, LLP

(57) ABSTRACT

A three-dimensional fast spin echo (FSE) scan is performed by stepping (220) through a plurality of phase encode k-space views from a computed view list (210). The view list is computed such that (i) magnetic resonance echoes having a selected image contrast are encoded in the center of k-space, (ii) adjacent data lines in k-space have similar contrast, and (iii) common planes of data lines in k-space are completed at regular intervals. As each data line is read, it is Fourier transformed (230) and stored (240) within a fast-access memory (52). Once a plane of data lines is acquired, it is Fourier transformed (250) along a second direction using a plurality of parallel processors (54). The twice-transformed data is stored (260) in conventional memory (56). Once all of the phase encode views on the view list are acquired, a final Fourier transform (60) along a third direction is performed (270), rendering a volumetric image representation. The method of data acquisition uses fewer memory buffers and takes less time than conventional methods.

22 Claims, 3 Drawing Sheets

TIME AND MEMORY OPTIMIZED METHOD OF ACQUIRING AND RECONSTRUCTING MULTI-SHOT 3D MRI DATA

BACKGROUND OF THE INVENTION

The present invention relates to magnetic resonance data acquisition. It finds particular application in conjunction with multi-shot fast-spin echo (FSE) imaging and will be described with particular reference thereto. It is to be appreciated, however, that the invention will also find application in conjunction with other imaging sequences, such as single shot FSE, multi-shot gradient echo, and three-dimensional EPI.

Conventionally, magnetic resonance imaging includes the sequential pulsing of radio frequency signals and magnetic field gradients across a region to be imaged. A patient is disposed in a region of interest in a substantially uniform magnetic field. In two-dimensional imaging, an RF excitation pulse is applied as a slice select gradient is applied across the field to select a slice or other region of the patient to be imaged. A phase encode gradient is applied along one of the axes of the selected slice to encode material with a selected phase encoding. In each repetition of the pulse sequence, the phase encode gradient is stepped in regular intervals from a negative maximum phase encode gradient through a zero phase encode gradient to a positive maximum phase encode gradient. In three-dimensional volume imaging, a pair of phase encode gradients are applied along the two axes orthogonal to the read direction.

Often, fast spin echo (FSE) acquisitions are employed in order to acquire a complete magnetic resonance data set, i.e. a complete sampling of k-space, more quickly than conventional single echo acquisitions. A FSE imaging sequence is a multi-echo spin-echo sequence where different parts of k-space are recorded by different spin echoes. In FSE sequences, the echo amplitude is modulated as a function of the echo position. In such sequences, the early echoes have the most magnetic resonance signal and the least artifacts as compared with the later echoes. In addition, the ratio of $T_1$ to $T_2$ contrast varies along the echo train. Generally, it is desirable to encode the echoes to place the most desirable echo at the center of k-space and the least desirable echo at the edges of k-space. Spiral and elliptical centric ordered trajectories through k-space have been employed in order to acquire the central portion of k-space first.

Current magnetic resonance scanners organize three-dimensional FSE acquisitions in one of two ways. In one technique, primary views are assigned to echo numbers within the echo train so as to produce the desired contrast, while successive echo trains step through all secondary encodings until all views are acquired. In another technique, the number of secondary encodings is set equal to the echo train length, and each echo train collects all of the secondary encodings for a fixed primary encoding. Reconstruction of image data acquired using these two methods requires large amounts of fast-access memory in proportion to either the image resolution or the echo train length. While the second technique is more memory efficient, it places severe constraints on slice resolution and contrast.

A typical centric ordered acquisition requires enough memory to store the entire acquisition. For example, in a magnetic resonance acquisition having 1024×1024 resolution, a 4-channel phased array RF coil configuration, 50 slices, and 5 repetitions, approximately 1.6 gigabytes of fast-access memory would be required for one frame. The entire five frame acquisition would require 8 gigabytes of memory.

Therefore, a need exists for time and memory-efficient technique for acquiring and reconstructing multi-shot, three-dimensional magnetic resonance data. The present invention contemplates a new and improved data acquisition and reconstruction method which overcomes the above-referenced problems and others.

SUMMARY OF THE INVENTION

In accordance with one aspect of the present invention, a method of magnetic resonance imaging is provided which includes exciting magnetic resonance in a volume of interest and inducing a train of magnetic resonance echoes, where the echoes generate magnetic resonance echo signals. An ordered list of k-space views to be sampled is computed. Each magnetic resonance echo of the train is phase and frequency encoded into predetermined regions of a three-dimensional k-space in accordance with the ordered view list. Each encoded magnetic resonance echo is sampled in order to create a row of data. A plurality of one-dimensional Fourier transforms are performed along a first direction on each row of data. The transformed rows of data are assigned and stored in one of a plurality of predetermined fast access memory buffers. Upon sampling a complete plane of k-space, a plurality of Fourier transforms are performed along a second direction which is orthogonal to the first direction. The twice transformed data is stored into an intermediate memory media and upon sampling each k-space view, a plurality of Fourier transforms are performed along a third direction which is orthogonal to the first and second directions, rendering a volumetric image representation.

In accordance with a more limited aspect of the present invention, the computing and phase and frequency encoding steps of the present method include ordering the k-space views to be sampled such that magnetic resonance echoes having a desired $T_1$ and $T_2$ contrast are encoded within the center of the three-dimensional k-space.

In accordance with a more limited aspect of the present invention, the computing step includes ordering the k-space views to be sampled such that successive k-space views are within a common plane along the second direction which is orthogonal to the first direction.

In accordance with another aspect of the present invention, in a magnetic resonance imaging apparatus, a main magnetic field is generated through a volume of interest. Radio frequency pulses are transmitted for exciting and inverting magnetic resonance dipoles within the volume of interest to generate a train of magnetic resonance echoes. Gradient magnetic fields are generated to phase and frequency encode the magnetic resonance echoes and a receiver receives and demodulates the magnetic resonance echoes-to produce a series of k-space views. A method of magnetic resonance data acquisition includes receiving at least one inputted scan parameter and dividing a three-dimensional k-space into a plurality of regions, where each region is to be filled by data from one echo of the train of echoes. An optimized data collection command list is computed in response to the at least one inputted scan parameter. The data collection command list includes a plurality of phase encode instructions to fill rows of k-space which lie in common planes. In accordance with the optimized data collection command list, the plurality of phase-encode views are stepped through with each view producing a row of data. Each row of data is Fourier transformed as it is collected and stored in a plurality of fast access memory buffers. Upon collection of one complete plane of k-space data, a second Fourier transform is performed on the data. The twice transformed data is stored in a magnetic media memory. Upon collecting all of the phase encode views on the command list, a third Fourier transform is performed on the data.

In accordance with another aspect of the present invention, a magnetic resonance volume imaging method includes exciting a plurality of multi-echo imaging sequences, each sequence having n echoes, where n is a plural integer. The n echoes have n progressively changing contrast levels. Each echo is read out along a frequency encode axis and is phase encoded along first and second phase encode axes perpendicular to the frequency encode axis and each other. The echoes are phase encoded such that echoes with a preselected level of contrast are encoded closest to a center of k-space and echoes with a contrast furthest from the preselected contrast are phase encoded closest to a periphery of k-space. Echoes with other contrasts are phase-encoded proportionately in between. The echoes are read out to form data lines which are one-dimensionally Fourier transformed. The one-dimensionally transformed data lines are stored until a full plane of data lines is stored. The stored plane of data lines is Fourier transformed in a second dimension. The two-dimensionally transformed planes of data lines are stored until a full volume of data lines is stored. The full volume of data lines is Fourier transformed in a third dimension to create a volumetric image representation.

In accordance with another aspect of the present invention, a magnetic resonance apparatus includes a main magnet for generating a temporally constant magnetic field through an examination region. A radio frequency transmitter excites and inverts magnetic resonance dipoles within the examination region to generate a train of magnetic resonance echoes. Gradient magnetic field coils and a gradient magnetic field pulse amplifier generate at least phase and read magnetic field pulses in orthogonal directions across the examination region. A receiver receives and demodulates the magnetic resonance echoes to produces a series of k-space views. A view order processor computes a view list of phase-encode k-space views to be sampled. A scan controller steps through the view list and controls the gradient pulse amplifier and radio frequency transmitter to generate a plurality of fast spin echo pulse sequences. A plurality of Fourier transform processors perform a plurality of one-dimensional Fourier transforms along three orthogonal directions on the received k-space views. A fast-access memory selectively stores the once Fourier transformed k-space views and a magnetic media memory stores the twice Fourier transformed k-space planes.

In accordance with a more limited aspect of the present invention, the view order processor includes means for optimizing the order of the view list according to a desired $T_1$ and $T_2$ contrast. The view order processor further includes means for optimizing the order of the view list in order to fill rows of k-space which lie in. common planes.

One advantage of the present invention resides in a time-efficient magnetic resonance data acquisition. and reconstruction technique.

Another advantage of the present invention resides in a memory-efficient magnetic resonance data acquisition and reconstruction technique.

Another advantage of the present invention is that is provides better control of contrast with reduced multi-shot artifacts for three-dimensional multiple echo train sequences.

Another advantage of the present invention is that the data acquisition order may be organized to minimize slab edge defects.

Another advantage of the present invention resides in improved image quality.

Still another advantage of the present invention is that it provides faster image reconstruction.

Other benefits and advantages of the present invention will become apparent to those skilled in the art upon a reading and understanding of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DESCRIPTION OF THE PREFERRED EMBODIMENTS

Figure 1:
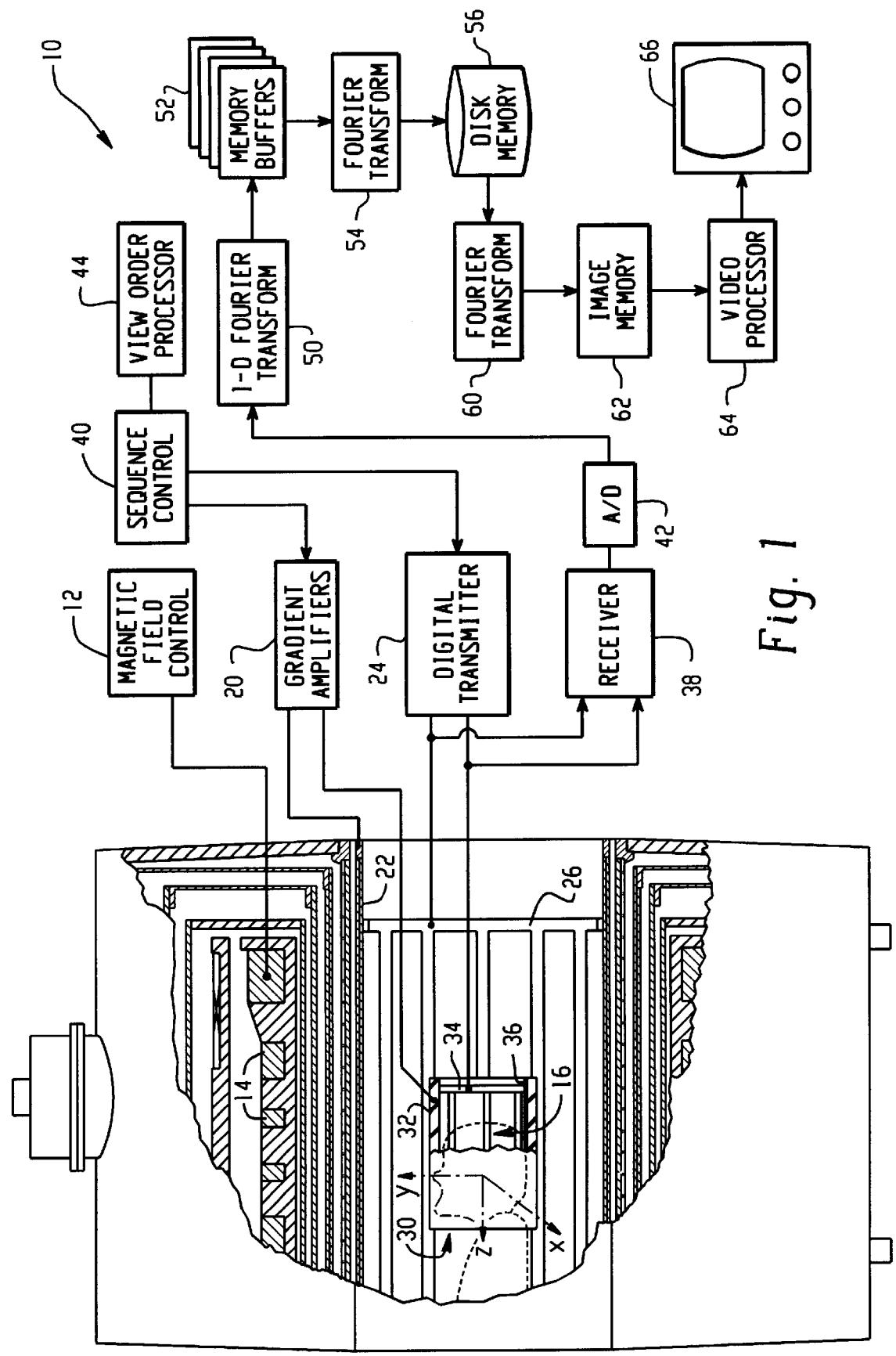
FIG. 1 is a diagrammatic illustration of a magnetic resonance imaging apparatus in accordance with the present invention.

With reference to FIG. 1, a magnetic resonance imaging system 10 includes a main magnetic field control 12 which controls superconducting or resistive magnets 14 such that a substantially uniform, temporally constant magnetic field ($B_0$) is created along a z-axis through an examination or image region 16. A magnetic resonance echo means applies a series of radio frequency ($B_1$) and magnetic field gradient pulses to invert or excite magnetic spins, induce magnetic resonance, refocus magnetic resonance, manipulate magnetic resonance, spatially and otherwise encode the magnetic resonance, saturate spins, and the like in order to generate magnetic resonance imaging and spectroscopy sequences.

More specifically, gradient pulse amplifiers 20 apply current pulses to selected ones or pairs of whole body gradient coils 22 to create magnetic field gradients along x, y, and z-axes of the examination region. In other words, by selectively applying current pulses to appropriate ones of the gradient field coils, slice select, phase encode, and read gradients are selectively applied along mutually orthogonal axes. In two-dimensional imaging, the slice select gradients define an image slice or region and the phase encode and read gradients encode the magnetic resonance along mutually orthogonal axes within the slice. In three-dimensional imaging, a pair of phase encode-gradients are applied to step in a plane orthogonal to the read direction. A digital radio frequency transmitter 24 transmits radio frequency pulses or pulse packets to a whole-body RF coil 26 to transmit $B_1$ pulses into the examination region. The $B_1$ pulses are used to saturate spins, excite resonance, invert magnetization, refocus resonance, or manipulate resonance in selected portions of the examination region. The resonance signals are picked up by the whole-body RF coil 26.

To generate images of limited regions of the subject, local coils are placed contiguous to the selected region. For example, an insertable head coil 30 is inserted surrounding a selected brain region at the isocenter of the bore. The insertable head coil 30 includes local gradient coils 32 which receive current pulses from the gradient amplifiers 20 to create magnetic field gradients along x, y, and z-axes in the examination region within the head coil 30. A local radio frequency $B_1$ coil 34 is used to excite magnetic resonance and receive magnetic resonance signals emanating from the patient's head. In one embodiment, the local coil is a surface or multiple loop array. Alternatively, a receive-only local radio frequency coil can be used to receive resonance signals induced by body-coil RF transmissions. An RF screen 36 blocks the $B_1$ signals from the head coil from inducing eddy currents in the gradient coils and surrounding structures. The resultant radio frequency signals which are picked-up by the whole-body RF coil 26, the local RF coil 34, or other specialized RF coils are demodulated by a receiver 38.

A sequence control processor or scan controller 40 controls the gradient pulse amplifiers 20 and the transmitter 24 to generate any of a plurality of multiple echo sequences, including echo-planar imaging, echo-volume imaging, gradient and spin echo imaging, fast spin echo imaging, and the like. More particularly, the scan controller 40 steps through a view list computed by a view list processor 44. The view list processor 44 computes a list of commands, which includes a list of phase encode views, open and close memory buffer instructions, such as (open pview1), (pview1, sview1), (pview2, sview2), . . . , (close pview 1), and transform buffer instructions. As is described more fully below, the view order processor 44, computes an optimized command list in response to inputted scan parameters, such as primary and secondary phase encode resolution, echo train length, and desired contrast.

For the selected sequence, the receiver 38 outputs a plurality of data lines in rapid succession following each RF excitation pulse. Preferably, the receiver 38 is a digital receiver or, as shown in FIG. 1, is accompanied by an analog-to-digital converter 42 for converting each data line into a digital format.

As each magnetic resonance signal or echo is collected and/or sampled by the receiver 38 and analog-to-digital converter 42, the read-out raw magnetic resonance data in a $k_x$ dimension is Fourier transformed 50 in the read-out direction and loaded into an acquired data memory buffers 52 or a memory matrix. Preferably, each memory buffer is a fast-access memory, such as fast cache, which holds one Fourier transformed data line. In a preferred embodiment 22, buffers are adequate for 256×256×256 image reconstruction. In other words, the acquisition of the magnetic resonance data is considered sampling of the three-dimensional k-space. Two of the dimensions, $k_y$ and $k_z$, are preferably sampled by applying different phase encoding gradients, $G_y$ and $G_z$, during each pulse sequence of the scan, and each acquired magnetic resonance signal contains multiple samples in the $k_x$ direction. The pulse sequence is repeated for as many repetitions as are necessary to sample all desired $k_y$ and $k_z$ values in accordance with the computed command list.

The scan controller 40 steps through the phase encode view list computed by the view order processor 44 in order to fill rows of k-space which lie in common planes as quickly as possible. Each Fourier transformed line of data is stored in the fast-access memory buffers 52 until the first plane of data is acquired. Once any plane is complete, a second Fourier transform processor 54 performs a second Fourier transform on the complete plane of data, while other planes are being acquired. Preferably, the second Fourier transforms are performed by a series of parallel Fourier transform processors. The planes of twice transformed data are stored in slower access memory 56, such as magnetic media or main memory.

The twice transformed data is transferred to a third series of Fourier transform processors 60, which perform a third one-dimensional Fourier transform on the data along the third dimension, completing the reconstruction of the data. The reconstructed data is stored in an image memory 62. The stored data is processed by a video processor 64 for display on a human-viewable display, such as a video monitor.

Figure 2:
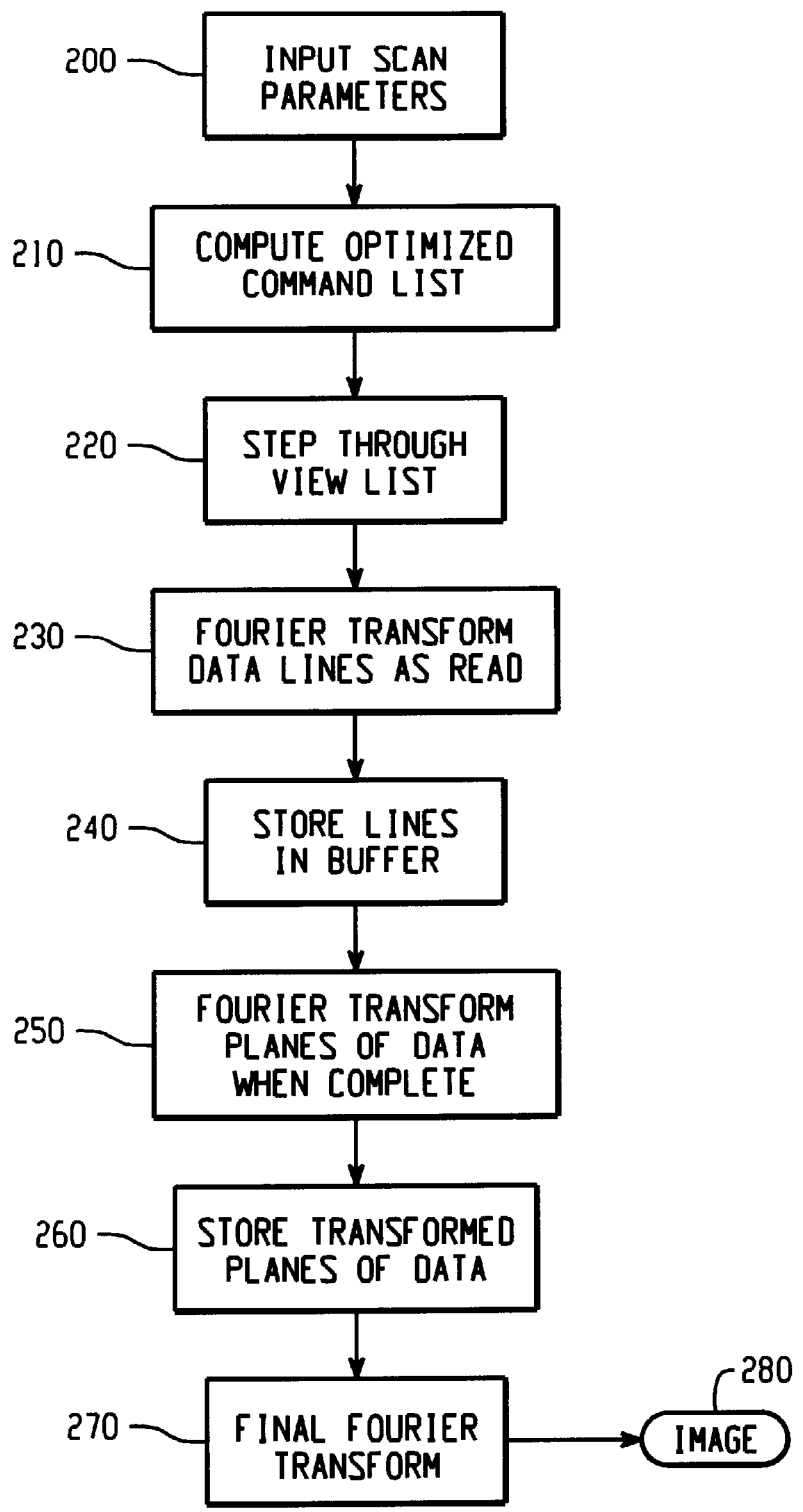
FIG. 2 is a flow chart illustrating one embodiment of the magnetic resonance imaging method in accordance with the present invention.

With reference to FIG. 2, prior to performing a magnetic resonance scan, scan parameters are inputted 200 by the user. Such scan parameters include primary and secondary phase encode resolution, fractional undersampling, echo train length, and desired contrast. The scan software optimizes 210 the acquisition in response to the input scan parameters 200. More particularly, the view order processor computes an optimized command list, which includes a list of phase encode views to be sampled, open and close buffer instructions, and Fourier transform instructions.

The data acquisition is optimized with respect to correct image contrast as well as efficient data processing for a three-dimensional, multi-echo train acquisition. The sampling order of phase encode views is optimized to bring about the desired $T_1$ to $T_2$ contrast. Preferably, the data is acquired using a fast spin echo (FSE) pulse sequence, employing a four-echo train. However, it is to be appreciated that the present invention is applicable to FSE sequences having echo trains with greater or fewer echoes as well as to other pulse sequences, particularly fast imaging sequences. Artisans will appreciate that $T_1$ to $T_2$ contrast varies in each echo along the echo train.

Preferably, the most desirable echo of the train is encoded at the center of k-space and the least desirable echo is encoded at the edge of k-space. In one embodiment, illustrated in FIG. 3, the second echo 310 in a four-echo train has the desired contrast, and is encoded in the center of k-space. The third echo 320 is next best and encoded near the center of k-space. The first 300 is about as good as the second and is also adjacent the center. The fourth 330 echoes are encoded nearer the edge as shown. The FIG. 3 segmentation also avoids the juxtaposition of echoes having very different contrast. In other-words, the second echo is encoded into the center of k-space, while the first and fourth echoes are not adjacent to one another. Even juxtaposition of first and third echoes and second and fourth echoes is avoided. Artisans will appreciate that avoiding the juxtaposition of the first and fourth echoes avoids significant image artifacts. It is to be appreciated that other k-space segmentation may be employed.

Figure 3:
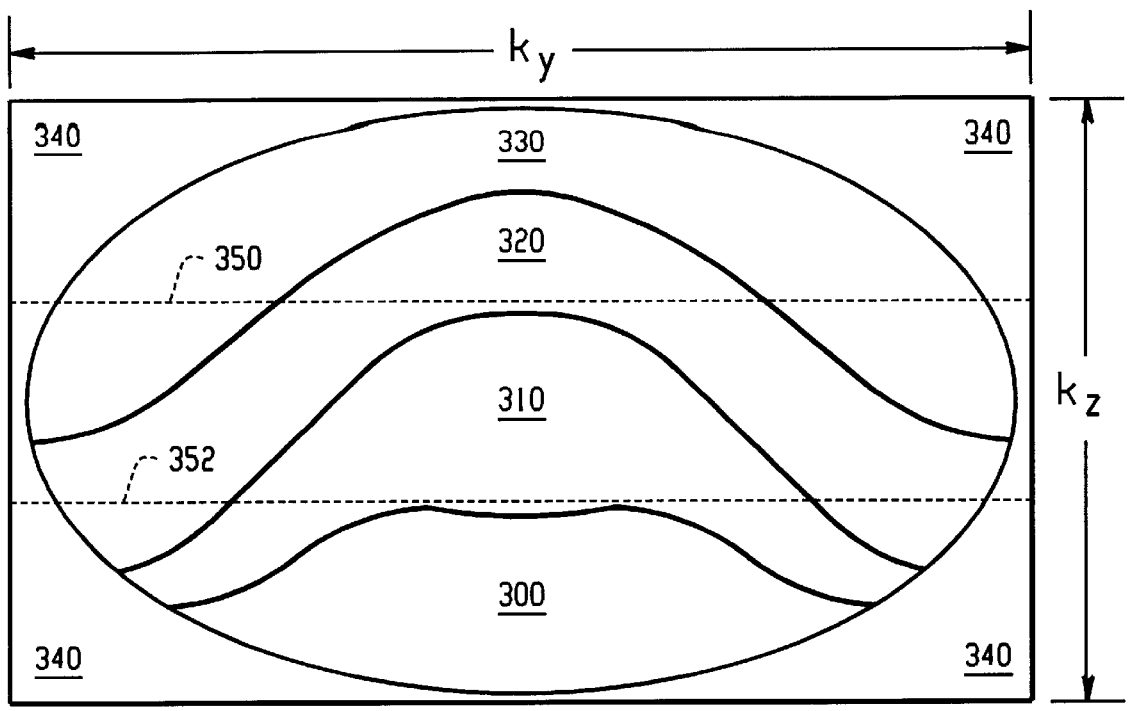
FIG. 3 is a graphical representation of a two-dimensional phase encode k-space plane illustrating. one exemplary k-space segmentation in accordance with the present invention.

A non-rectangular portion of k-space, preferably elliptical, is sampled in accordance with the computed view list. As shown in FIG. 3, the corners of k-space 340 are left unsampled. The elliptical sampling geometry facilitates fractional elliptical zero padding. It is to be appreciated that the elliptical sampling geometry provides optimal k-space coverage for a given scan time.

In addition to correct image contrast, the view list 210 is computed to facilitate efficient data processing for a three-dimensional, multi-echo train scan. As described more fully below, the data is acquired in order to fill rows of k-space which lie in common planes as quickly as possible. Therefore, the k-space rows are not encoded in an orderly spiral or other conventional trajectory. For example, the echoes could be encoded to fill a plane 350. The first echo data could be encoded to fall along a plane 352. Once all the second echo data along plane 350 is collected, the second echo can also be encoded along the plane 352, then when data is collected along the plane 352, it can be completed relatively quickly while fourth echo data is encoded along another plane.

The scan controller then steps through the views 220 in the view list, rather than counting through phase encode views in order. Fourier read transforms are applied 230 as data lines arrive. The transformed lines of data are stored 240 in read x slice buffers within a fast-access memory, such as fast cache memory. As is described more fully below, the read x slice buffers are assigned by open instructions within the optimized command list. In accordance with the optimized command list, the data is acquired in order to fill rows of k-space, which lie in common planes, as quickly as possible. Once the first plane of data is complete, i.e., one buffer of data is filled, the second Fourier transform operation 250 is commenced, while the system acquires data to complete the next plane. In other words, secondary encode transforms are performed when close buffer instructions are encountered.

The results of the second Fourier transforms 250 are stored in a slower mass memory 260, such as in main memory or on magnetic disks. Once substantially all of the data is acquired, twice transformed, and stored in mass memory, the series of third Fourier transforms 270 are performed. It is to be appreciated that completion of data acquisition, substantially all of the second Fourier transforms have been performed, which cuts the delay before image reconstruction in half. In one embodiment, the series of third Fourier transforms are performed from the center of k-space outward. This ordering of third transforms facilitates the near immediate display of a low resolution image, with the resolution steadily improving as the reconstruction continues.

Figure 4:
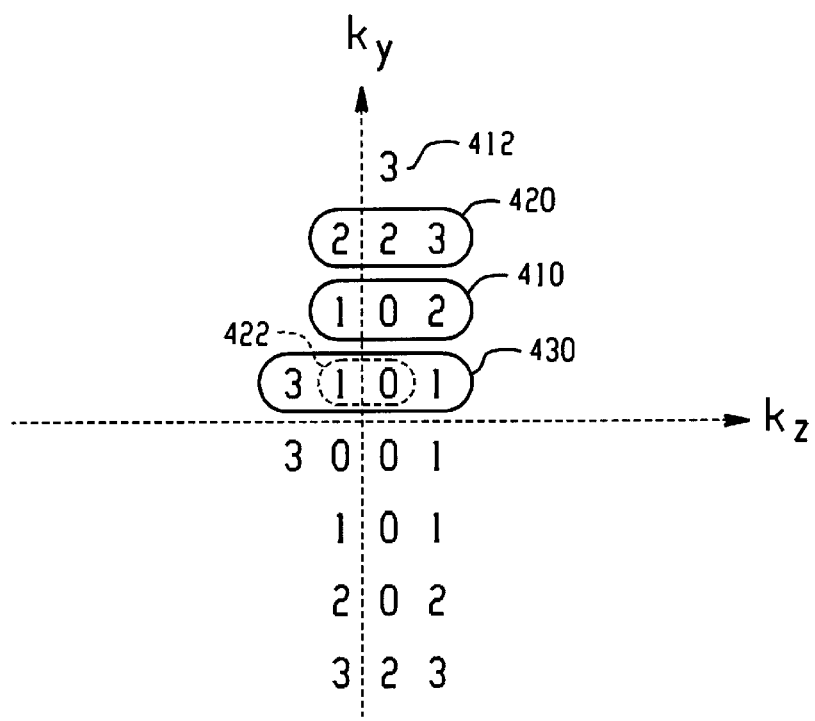
FIG. 4 is an exemplary graphical representation of a two-dimensional phase encode k-space plane illustrating k-space views acquired in accordance with the present invention.

With reference to FIG. 4 and continuing reference to FIG. 1, an exemplary prototype for a small number of phase encode views is provided. In this example, the primary encode transform size is eight, while the secondary encode transform size is four. The echo train length is four and the desired sampling ratio is 0.800. In this example, four memory buffers, numbered 0–3, are used to store the once-transformed data. In response to this input data, as well as other scan parameters, the following optimized command list is generated by the view order processor 44.
1. allocate buffer=0 to pview=2
2. allocate buffer=1 to pview=0
3. get view for buffer=0; sview=2
4. get view for buffer=0; sview=1
5. get view for buffer=0; sview=3
6. get view for buffer=1; sview=2
7. transform buffer=1
8. transform buffer=0
9. allocate buffer=0 to pview=3
10. allocate buffer=1 to pview=1
11. get view for buffer=0; sview=2
12. get view for buffer=0; sview=1
13. get view for buffer=1; sview=1
14. get view for buffer=1; sview=3
15. allocate buffer=2 to pview=5
16. get view for buffer=2; sview=2
17. get view for buffer=0; sview=3
18. get view for buffer=1; sview=2
19. get view for buffer=0; sview=0
20. transform buffer=1
21. transform buffer=0
22. allocate buffer 0 to pview=6
23. allocate buffer=1 to pview=7
24. get view for buffer=0; sview=2
25. get view for buffer=2; sview=1
26. get view for buffer=0; sview=1
27. get view for buffer=1; sview=1
28. allocate buffer=3 to pview=4
29. get view for buffer=3; sview=1
30. get view for buffer=2; sview=3
31. get view for buffer=0; sview=3
32. get view for buffer=1; sview=3
33. transform buffer=2
34. transform buffer=0
35. get view for buffer=3; sview=2
36. get view for buffer=3; sview=3
37. get view for buffer=1; sview=2
38. get view for buffer=3; sview=0
39. transform buffer=1
40. transform buffer=3

The optimized command list contains open and close buffer instructions, phase encode k-space views to be sampled, and transform instructions. To sample the portion of k-space shown in FIG. 4, six excitations of a four-echo FSE sequence are required. From the first excitation, four spin echoes are induced, phase encoded, and read out according to commands 3–6. From commands 3–5, three rows of k-space data within a common plane 410 are acquired and one row 412 of last echo data of another plane. With these two planes 410, 412 completely sampled, commands 7 and 8 order the second Fourier transform of those planes, saving the result to disk, and making those buffers available. Similarly, the next echo sequence can have the last two echoes encoded in row 420 and the first two-echoes 422 in a row 430. The next four echo sequence can complete rows 420, 430, and so forth.

For a complete three-dimensional acquisition having primary and secondary encode transform sizes of 256, an echo train length of 64, and a desired sampling ratio of 0.800, twenty-two buffers are required. In contrast, conventional encoding orders would require either 64 or 256 buffers, corresponding to either the secondary encode size or echo train length. It is to be appreciated that the optimized command list pattern will vary with the size of the image volume, the number of parallel processors to perform the Fourier transforms, the number of buffers, and other hardware constraints.

The invention has been described with reference to the preferred embodiment. Modifications and alterations will occur to others upon a reading and understanding of the preceding detailed description. It is intended that the invention be construed as including all such modifications and alterations insofar as they come within the scope of the appended claims or the equivalents thereof.

Having thus described the preferred embodiments, the invention is now claimed to be:

1. A method of magnetic resonance imaging comprising:
   (a) exciting magnetic resonance in a volume of interest;
   (b) inducing a train of magnetic resonance echoes, said echoes generating magnetic resonance echo signals;
   (c) computing an ordered list of k-space views to be sampled;
   (d) phase and frequency encoding each magnetic resonance echo of the train into predetermined regions of a three-dimensional k-space in accordance with the ordered view list;

(e) sampling each encoded magnetic resonance echo to create a row of data;

(f) performing a plurality of one-dimensional Fourier transforms along a first direction on each row of data;

(g) assigning and storing the transformed rows of data in one of a plurality of predetermined fast-access memory buffers;

(h) upon sampling a complete plane of k-space, performing a plurality of Fourier transforms along a second direction which is orthogonal to the first direction;

(i) storing the twice-transformed data into an intermediate memory media; and (j) upon sampling each k-space view in accordance with step (e), performing a plurality of Fourier transforms along a third direction which is orthogonal to the first and second directions, rendering a volumetric image representation.

2. The magnetic resonance imaging method according to claim 1, wherein steps (c) and (d) include:

ordering the k-space views to be sampled such that magnetic resonance echoes having a desired $T_1$ and $T_2$ contrast are encoded within the center of the three-dimensional k-space.

3. The magnetic resonance imaging method according to claim 2, wherein step (c) further includes:

ordering the k-space views to be sampled such that successive k-space views are within a common plane along the second direction which is orthogonal to the first direction.

4. The magnetic resonance imaging method according to claim 1, wherein step (c) is performed in response to at least one inputted scan parameter, said scan parameters including (i) primary phase encode resolution; (ii) secondary phase encode resolution; (iii) fractional undersampling; (iv) echo train length; and (v) desired contrast.

5. The magnetic resonance imaging method according to claim 1, wherein steps (f), (h), and (j) are performed by a plurality of parallel Fourier transform processors.

6. The method of magnetic resonance imaging according to claim 1, wherein the sampled portions of the three-dimensional k-space are ellipsoidal in cross-sectional shape.

7. The method of magnetic resonance imaging according to claim 6, wherein unsampled portions of the three-dimensional k-space are zero-filled.

8. The method of magnetic resonance imaging according to claim 1, wherein step (j) is performed from the center of k-space outward, producing an initial low-resolution volumetric image representation.

9. In a magnetic resonance imaging apparatus in which a main magnetic field is generated through a volume of interest, radio frequency pulses are transmitted for exciting and inverting magnetic resonance dipoles within the volume of interest to generate a train of magnetic resonance echoes, gradient magnetic fields are generated to phase and frequency encode the magnetic resonance echoes, and a receiver receives and demodulates the magnetic resonance echoes to produce a series of k-space views, a method of magnetic resonance data acquisition includes:

receiving at least one inputted scan parameter;

dividing a three-dimensional k-space into a plurality of regions, each region to be filled by data from one echo of the train of echoes;

computing an optimized data collection command list in response to the at least one inputted scan parameter, said data collection command list including a plurality of phase encode instructions to fill rows of k-space which lie in common planes;

in accordance with the optimized data collection command list stepping through the plurality of phase encode views, each view producing a row of data;

Fourier transforming each row of data as it is collected;

storing the once transformed data in a plurality of fast-access memory buffers;

upon collection of one complete plane of k-space data, performing a second Fourier transform on the data;

storing the twice transformed data in a magnetic media memory; and upon collecting all of the phase encode views on the command list, performing a third Fourier transform on the data.

10. The magnetic resonance data acquisition method according to claim 9, wherein the third Fourier transform is performed from the center of k-space outward, producing an initial low-resolution volumetric image representation.

11. The magnetic resonance data acquisition method according to claim 9, wherein the optimized data collection command list includes sequential open and close memory buffer instructions, phase encode views, and Fourier transform instructions.

12. The magnetic resonance data acquisition method according to claim 9, wherein the Fourier transform steps are performed by a plurality of parallel Fourier transform processors.

13. The magnetic resonance data acquisition method according to claim 9, wherein the collected k-space views sample an ellipsoidal portion of k-space.

14. The magnetic resonance data acquisition method according to claim 13, wherein unsampled portions of k-space are zero-filled.

15. A magnetic resonance volume imaging method comprising:

exciting a plurality of multi-echo imaging sequences, each sequence having n echoes, where n is a plural integer, the n echoes having n progressively changing contrast levels, each echo being read out along a frequency encode axis and being phase encoded along first and second phase encode axes perpendicular to the frequency encode axis and each other;

phase encoding the echoes such that echoes with a preselected level of contrast are encoded closest to a center of k-space, echoes with a contrast farthest from the preselected contrast are phase encoded closest to a periphery of k-space, and echoes with other contrasts are phase encoded proportionately in between;

reading out echoes to form data lines;

one-dimensionally Fourier transforming each data line;

storing the one-dimensionally transformed data lines until a full plane of data lines is stored;

Fourier transforming the stored plane of data lines in a second dimension;

storing the two-dimensionally transformed planes of data lines until a full volume of data lines is stored;

Fourier transforming the full volume of data lines in a third dimension to create a volumetric image representation.

16. The method according to claim 15 wherein the echoes are phase encoded such that every data line is neighbored in two dimensions by data lines whose contrast differs by at most one level.

17. The method according to claim 16 wherein the echoes are phase encoded such that full planes of data lines are completed at regular intervals to distribute the Fourier transforming in the second dimension.

18. The method according to claim 17 wherein no echoes are phase encoded adjacent corners of k-space and the data lines adjacent the corners of k-space are zero-filled.

19. A magnetic resonance apparatus comprising:

a main magnet for generating a temporally constant magnetic field through an examination region;

a radio frequency transmitter for exciting and inverting magnetic resonance dipoles within the examination region to generate a train of magnetic resonance echoes;

gradient magnetic field coils and a gradient magnetic field pulse amplifier for generating at least phase and read magnetic field pulses in orthogonal directions across the examination region;

a receiver for receiving and demodulating the magnetic resonance echoes to produce a series of k-space views;

a view-order processor which computes a view list of phase encode k-space views to be sampled;

a scan controller which steps through the view list, said scan controller controlling the gradient pulse amplifier and radio frequency transmitter to generate a plurality of fast spin echo (FSE) pulse sequences;

a plurality of Fourier transform processors which perform a plurality of one-dimensional Fourier transforms along three orthogonal directions on the received k-space views;

a fast-access memory for selectively storing once Fourier transformed k-space views; and a magnetic media memory portion for storing twice Fourier transformed k-space planes.

20. The magnetic resonance apparatus according to claim 19, wherein the view order processor computes an optimized k-space view list in response to at least one inputted scan parameter.

21. The magnetic resonance apparatus according to claim 20, wherein the inputted scan parameters include at least one of (i) primary phase encode resolution; (ii) secondary phase encode resolution; (iii) fractional undersampling; (iv) echo train length; and (v) desired contrast.

22. The magnetic resonance apparatus according to claim 19, wherein the view order processor includes:

means for optimizing the order of the view list according to a desired $T_1$ and $T_2$ contrast; and means for optimizing the order of the view list in order to fill rows of k-space which lie in common planes.

* * * * *